(12) United States Patent
Nenyei et al.

(10) Patent No.: US 7,977,258 B2
(45) Date of Patent: Jul. 12, 2011

(54) METHOD AND SYSTEM FOR THERMALLY PROCESSING A PLURALITY OF WAFER-SHAPED OBJECTS

(75) Inventors: Zsolt Nenyei, Blaustein (DE); Paul J. Timans, Mountain View, CA (US); Wilfried Lerch, Dornstadt (DE); Jüergen Niess, Sontheim (DE); Manfred Falter, Ulm (DE); Patrick Schmid, Donzdorf (DE); Conor Patrick O'Carroll, Vancouver BC (CA); Rudy Cardema, San Jose, CA (US); Igor Fidelman, Danville, CA (US); Sing-Pin Tay, Fremont, CA (US); Yao Zhi Hu, San Jose, CA (US); Daniel J. Devine, Los Gatos, CA (US)

(73) Assignee: Mattson Technology, Inc., Fremont, CA (US)

( * ) Notice: Subject to any disclaimer, the term of this patent is extended or adjusted under 35 U.S.C. 154(b) by 475 days.

(21) Appl. No.: 11/784,503

(22) Filed: Apr. 6, 2007

(65) Prior Publication Data
US 2008/0248657 A1 Oct. 9, 2008

(51) Int. Cl.
*H01L 21/00* (2006.01)
*F27B 9/14* (2006.01)
(52) U.S. Cl. ........................ 438/795; 432/122
(58) Field of Classification Search .............. 438/795; 156/222, 226; 432/122
See application file for complete search history.

(56) References Cited

U.S. PATENT DOCUMENTS

| | | | |
|---|---|---|---|
| 4,939,568 A * | 7/1990 | Kato et al. .................... 257/686 |
| 4,947,784 A | 8/1990 | Nishi | |
| 5,001,327 A | 3/1991 | Hirasawa et al. | |
| 5,083,030 A | 1/1992 | Stavov | |
| 5,290,367 A * | 3/1994 | Hayashi et al. ............... 136/255 |
| 5,305,416 A | 4/1994 | Fiory | |
| 5,305,417 A | 4/1994 | Najm et al. | |
| 5,414,244 A | 5/1995 | Imahashi | |
| 5,755,511 A | 5/1998 | Peuse et al. | |
| 5,861,609 A | 1/1999 | Kaltenbrunner et al. | |
| 5,960,159 A | 9/1999 | Ikeda et al. | |
| 5,965,047 A * | 10/1999 | Blersch et al. ............... 219/390 |
| 6,005,226 A | 12/1999 | Aschner et al. | |
| 6,051,512 A * | 4/2000 | Sommer et al. ............... 438/795 |
| 6,110,289 A | 8/2000 | Moore | |
| 6,217,663 B1 | 4/2001 | Inokuchi et al. | |
| 6,264,467 B1 | 7/2001 | Lue et al. | |
| 6,300,226 B1 | 10/2001 | Miyata et al. | |
| 6,414,280 B1 | 7/2002 | Nishitani et al. | |
| 6,462,411 B1 | 10/2002 | Watanabe et al. | |

(Continued)

OTHER PUBLICATIONS

F. Ikeda, "Dual Wafer RTP System for Large-Diameter Wafer Process," 4th International Conference on Advanced Thermal Processing of Semiconductors, 1996: p. 61-65.
PCT International Search Report for International Application No. PCT/US08/59228 dated Jul. 28, 2008.

(Continued)

*Primary Examiner* — W. David Coleman
(74) *Attorney, Agent, or Firm* — Dority & Manning, PA

(57) ABSTRACT

Process and system for processing wafer-shaped objects, such as semiconductor wafers is disclosed. In accordance with the present disclosure, a multiple of two wafers are processed in a thermal processing chamber. The thermal processing chamber is in communication with at least one heating device for heating the wafers. The wafers are placed in the thermal processing chamber in a face-to-face configuration or in a back-to-back configuration.

69 Claims, 9 Drawing Sheets

U.S. PATENT DOCUMENTS

| | | |
|---|---|---|
| 6,472,639 B2 | 10/2002 | Nishitani et al. |
| 6,793,734 B2 | 9/2004 | Takagi |
| 6,879,777 B2 | 4/2005 | Goodman et al. |
| 2003/0236642 A1 | 12/2003 | Timmans |
| 2005/0183854 A1 | 8/2005 | Gat |
| 2007/0006806 A1* | 1/2007 | Imai .............................. 118/620 |

OTHER PUBLICATIONS

S. Hirasawa et al., *Temperature distribution in semiconductor wafers heated in a hot-wall-type rapid diffusion furnace*, IEEE Transactions on Semiconductor Manufacturing, vol. 7,, No. 4, Nov. 1994, pp. 423-429.

D. Lowney et al., *Investigation of strain induced effects in silicon wafers due to proximity rapid thermal processing using micro-Raman spectroscopy and synchrotron x-ray topography*, Semiconductor Science and Technology 17 (2002), pp. 1081-1089.

Jeong-Gyoo Kim et al., *AES Study of Rapid Thermal Boron Diffusion into Silicon from a Solid Diffusion Source in Oxygen Ambient*, J. Electrochem. Soc., vol. 137, No. 9, Sep. 1990, pp. 2857-2860.

* cited by examiner

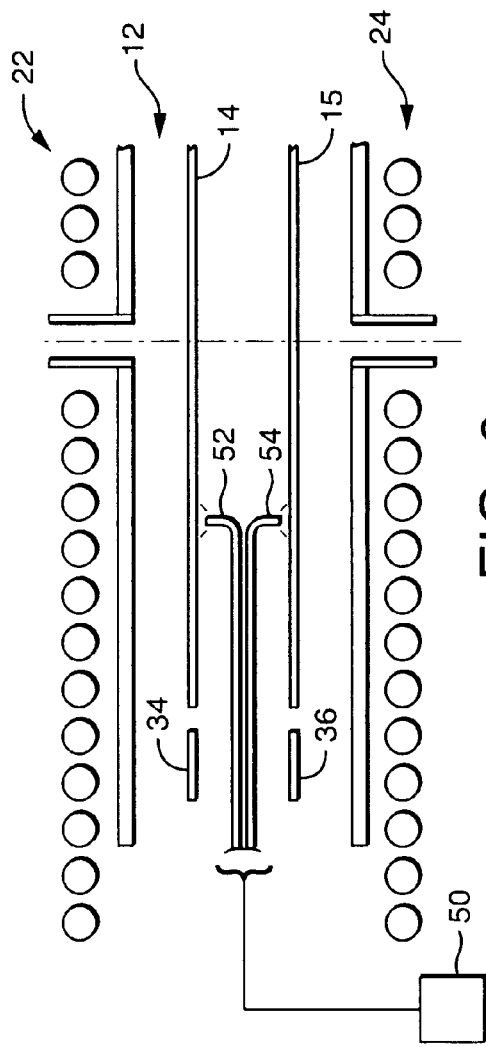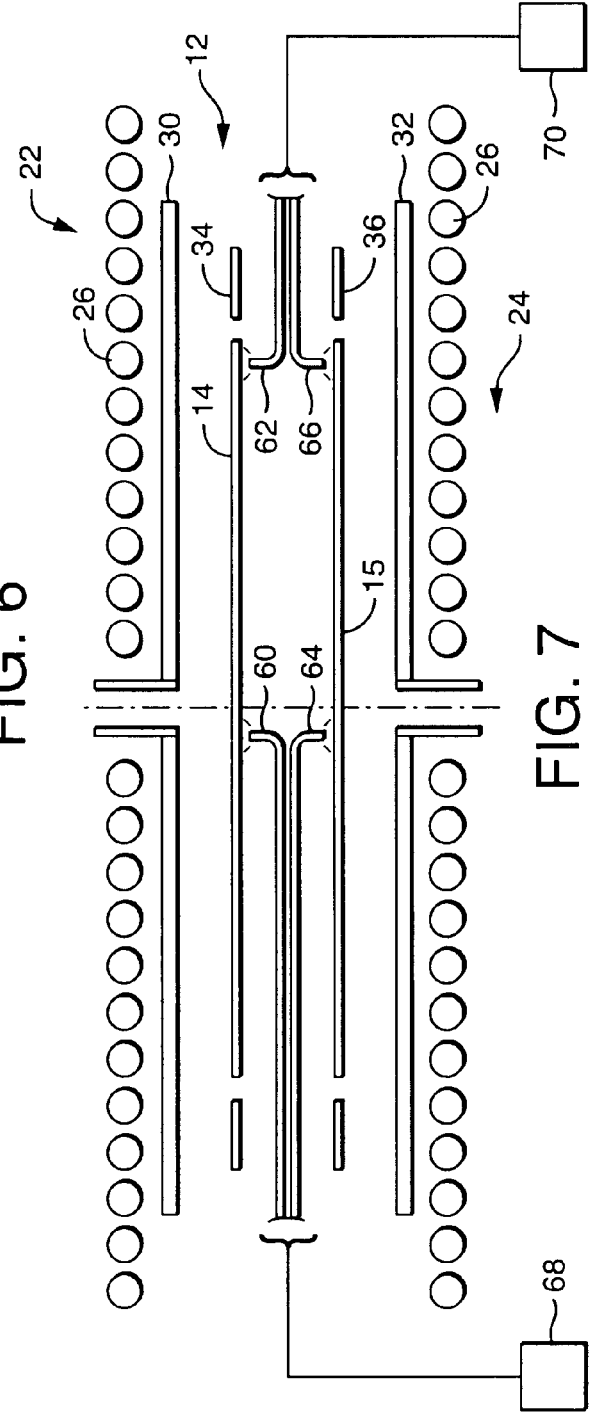

METHOD AND SYSTEM FOR THERMALLY PROCESSING A PLURALITY OF WAFER-SHAPED OBJECTS

BACKGROUND

Various heating devices have been proposed in the past for processing semiconductor wafers during the manufacture of integrated circuit chips. For instance, rapid thermal processing devices are thermal processing chambers where wafers are heated in a small compartment using radiant energy as the energy source. Such systems typically only process a single wafer at a time and include a substrate holder for holding the wafer and a light source that emits light energy for heating the wafer. During heat treatment, the semiconductor wafer is heated under controlled conditions according to a preset temperature regime. For monitoring the temperature of the semiconductor wafer during heat treatment, such processing chambers also typically include temperature sensing devices, such as pyrometers, that sense the radiation being emitted by a semiconductor wafer at a selected band or wavelength. By sensing the thermal radiation being emitted by the wafer, the temperature of the wafer can be calculated with reasonable accuracy.

In alternative embodiments, instead of or in addition to using radiation sensing devices, thermal processing chambers can also contain thermocouples for monitoring the temperature of the wafers. Thermocouples measure the temperature of objects by direct contact.

Many semiconductor heating processes require a wafer to be heated to high temperatures so that various chemical and physical reactions can take place as the wafer is fabricated into a device. During thermal processing, semiconductor wafers are typically heated to temperatures of from about 200° C. to about 1300° C., for times that are typically less than a few minutes.

Rapid thermal processing chambers that heat the wafers using light energy typically operate in a non-equilibrium state. Specifically, the walls surrounding the wafer are kept cool and thus the chambers are typically referred to as "cold wall" systems. The non-equilibrium configuration refers to the fact that the filament temperature inside the radiant source is at a much higher temperature than the wafer. The key advantage of using rapid thermal processing systems is the ability to quickly change wafer temperature therefore enabling very short heating cycles. A drawback to rapid thermal processing systems, however, is the cost per wafer processed, especially for cycles greater than one minute, since most systems are only equipped to heat one wafer at a time.

Thermal processing systems capable of processing a plurality of semiconductor wafers have been proposed. For instance, U.S. Pat. No. 6,051,512 discloses an apparatus and method for rapid thermal processing of a plurality of semiconductor wafers, which is incorporated herein by reference. The '512 patent has provided great advances in the art in that multiple wafers can be processed during a single heat cycle. The present disclosure is directed to further improvements in thermal processing chambers for processing multiple wafers simultaneously.

SUMMARY

In general, the present disclosure is directed to a method and system for thermally processing a plurality of wafer-shaped objects, such as semiconductor wafers. The wafer-shaped objects are processed in a thermal processing chamber. In accordance with the present disclosure, the thermal processing chamber is configured to process two wafers simultaneously that are arranged in the chamber in a face-to-face configuration or in a back-to-back configuration. In the past, thermal processing chambers configured to process multiple wafers taught stacking the wafers such that a face side of one wafer was positioned adjacent to the back side of an adjacent wafer. Having the wafers in a face-to-face configuration or in a back-to-back configuration, on the other hand, provides various advantages and benefits as will be described in greater detail below.

In one embodiment, the present disclosure is directed to a method of thermally processing a plurality of wafer-shaped objects by placing a first wafer-shaped object having a first side and a second and opposite side in a thermal processing chamber. The first side of the object comprises a working side configured to be modified while in the thermal processing chamber. The second side comprises a back side.

A second-wafer shaped object is placed into the thermal processing chamber also having a first side comprising a working side and a second and opposite side comprising a back side. The second wafer-shaped object is placed in the thermal processing chamber such that the first side of the wafer-shaped object faces the first side of the second wafer-shaped object or the second side of the first wafer-shaped object faces the second side of the second wafer-shaped object. Once the wafer-shaped objects are placed in the thermal processing chamber as described above, the objects are heated for altering at least one property of the wafer-shaped objects.

The wafer-shaped objects placed in the thermal processing chamber can have substantially similar diameters. The wafer-shaped objects can be oriented horizontally within the thermal processing chamber. For instance, in one embodiment, the wafer-shaped objects may be substantially parallel to each other within the chamber. The wafer-shaped objects can be placed relatively close to each other within the chamber or relatively far apart. For instance, in one embodiment, the objects can be less than about 4 mm apart, such as from about 1 mm to about 2 mm apart. Alternatively, the objects may be greater than about 4 mm apart, such as from about 5 mm to about 15 mm apart.

In order to heat the objects in the thermal processing chamber, the thermal processing chamber may be in communication with at least a first heating device. For instance, in one embodiment, the thermal processing chamber may be in communication with a first heating device and a second heating device. The first heating device and the second heating device may comprise a plurality of radiant energy sources. The radiant energy sources may be positioned outside of the chamber and separated from the chamber by a window.

In order to monitor the temperature of the objects within the thermal processing chamber, the system of the present disclosure can include a first temperature measuring device that measures the temperature of the first wafer-shaped object and a second temperature measuring device that measures the temperature of the second wafer-shaped object. In one embodiment, the temperature measuring devices may be in communication with a controller. The controller can be configured to control the heating devices for heating the wafer-shaped objects during processing. For instance, in one embodiment, the controller can heat the wafer-shaped objects using closed-loop control. Alternatively, the controller may use open-loop control. The first temperature measuring device and the second temperature measuring device may both comprise pyrometers. The pyrometers can include sensors for collecting thermal radiation being emitted by one of the wafer-shaped objects for calculating the temperature of the object. For instance, in one embodiment, the sensors for the pyrometers can be positioned in between the two wafer-shaped objects. Alternatively, both wafer-shaped objects may be positioned in between opposing sensors.

In one particular embodiment, the system may include two temperature measuring devices for measuring the temperature of the first wafer-shaped object and two temperature measuring devices for measuring the temperature of the second wafer-shaped object. For instance, one temperature measuring device may be used to measure a center region of the objects, while the other temperature measuring device may measure the temperature of a peripheral region of the wafer-shaped objects. In still other embodiments, more than two temperature measuring devices may be used to measure the temperature of each wafer. For instance, from about two to about seven temperature measuring devices may be positioned at different locations on each wafer.

In one embodiment, the thermal processing chamber can contain slip free rings that at least partially encircle each wafer-shaped object. The slip free rings, for instance, can be made from a material that heats up during processing and compensates for heat loss by the wafer-shaped objects through the edges of the objects. The slip free rings, for instance, can be positioned substantially in the same plane as the wafer-shaped objects and can have a thickness that is from about 50% to about 200% of the thickness of the wafer-shaped objects. The slip free rings can be made from any suitable material, such as silicon.

When loading and unloading the wafer-shaped objects into the thermal processing chamber, in one embodiment, the slip free rings can tilt or otherwise move in order to facilitate loading of the wafer-shaped objects into the chamber. As opposed to tilting within the chamber, the slip free rings can alternatively move in and out of the chamber with the wafer-shaped objects. In fact, in one embodiment, the slip free rings may actually hold the wafer-shaped objects within the thermal processing chamber.

The wafer-shaped objects can be supported within the thermal processing chamber using any suitable holding device that may be a part of the slip free rings or may be separate from the slip free rings. In one embodiment, the wafer-shaped objects are supported within the processing chamber within an edge exclusion region. The edge exclusion region, for instance, may be the outer most portion of the objects. For instance, the edge exclusion regions of the wafer-shaped objects may have a width of no greater than about 5 mm, such as from about 0.1 mm to about 3 mm. The wafer-shaped objects can be supported within the thermal processing chamber using, for instance, pins or ledges that may be made from any suitable material, such as fused silica, clear or opaque quartz, sapphire, aluminum oxide, aluminum oxynitride, silicon, silicon nitride, yttrium aluminum garnet (YAG), yttria, zirconia, hafnia or silicon carbide. The support structure used to hold the wafer-shaped objects can include, for instance, at least three landing areas where the objects are supported.

In one embodiment, the support structures within the thermal processing chamber may define inclined surfaces that contact the edges of the wafer-shaped objects.

The thermal processing chamber may include a first substrate holder for holding a first wafer-shaped object and a second substrate holder for holding a second wafer-shaped object. The first and second substrate holders may be configured to hold the wafer-shaped objects such that the working surface of one object faces the working surface of the adjacent object. Alternatively, the substrate holders may be configured so that the back side of the first wafer-shaped object may face the back side of the second wafer-shaped object.

If desired, the substrate holders can be configured to rotate the wafer-shaped objects within the thermal processing chamber. The objects can rotate in the same direction or can rotate in opposite directions. The thermal processing chamber, for instance, can be in communication with a rotation mechanism that rotates both wafer-shaped objects or may include a first rotation mechanism for rotating the first wafer-shaped object and a second rotation mechanism for rotating the second wafer-shaped object.

During processing, gases can be introduced into the thermal processing chamber. The gases, for instance, can be introduced into the chamber so that they flow in between the first and second wafer-shaped objects.

Other features and aspects of the present disclosure are discussed in greater below.

BRIEF DESCRIPTION OF DRAWINGS

A full and enabling disclosure including the best mode of practicing the appended claims and directed to one of ordinary skill in the art is set forth more particularly in the remainder of the specification. The specification makes reference to the appended figures, in which:

FIG. 6 is a cross-sectional view with cut away portions of another embodiment of a thermal processing chamber made in accordance with the present disclosure;

FIG. 7 is a cross-sectional view illustrating still another embodiment of a thermal processing chamber made in accordance with the present disclosure.

Use of like reference numerals in different features is intended to illustrate like or analogous components.

DETAILED DESCRIPTION

Figure 1A:
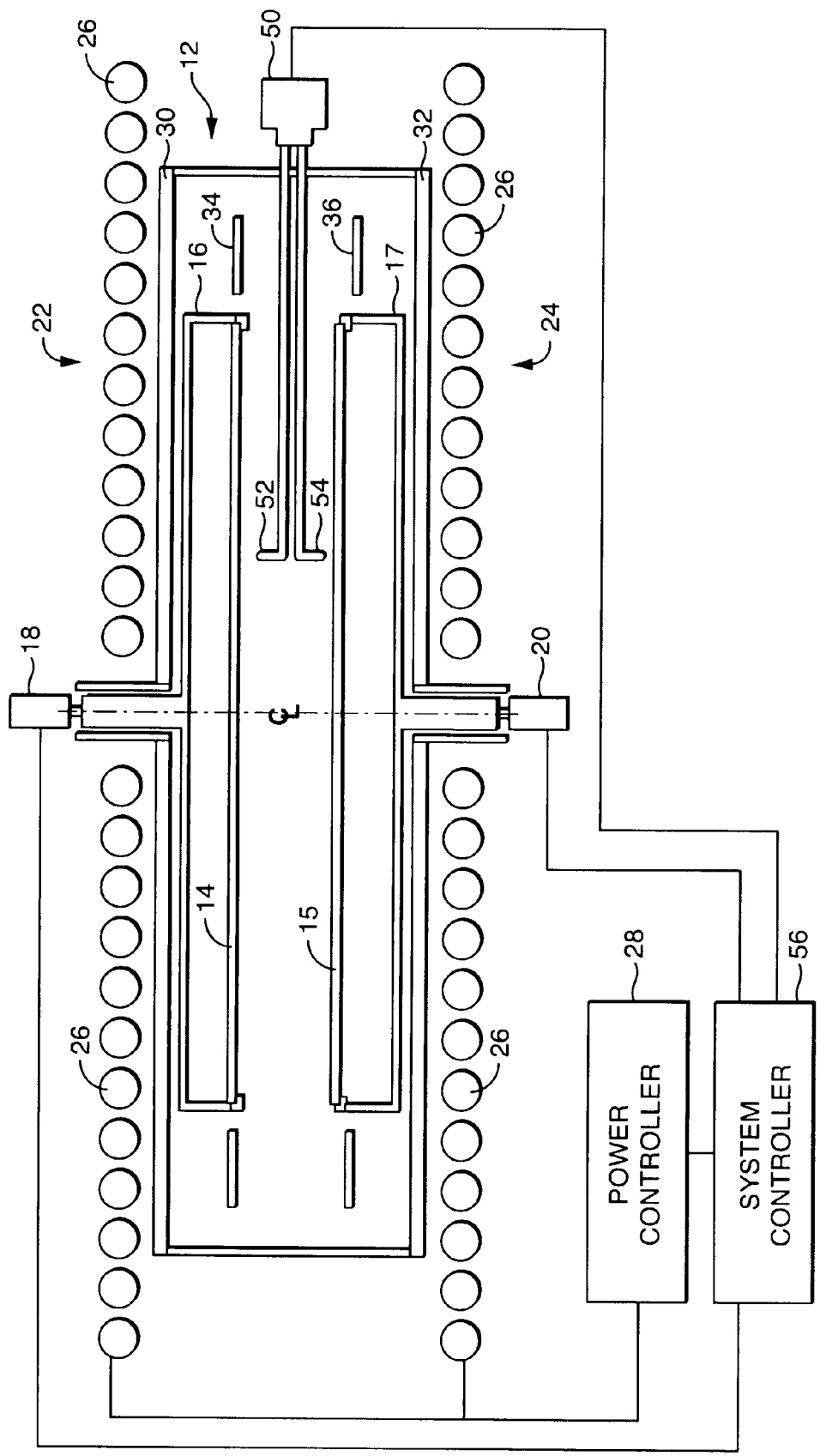
FIG. 1A is a cross-sectional view of one embodiment of a thermal processing system made in accordance with the present disclosure.

This disclosure now makes reference in detail to various and alternative exemplary embodiments and to the accompanying drawings, with like numerals representing substantially identical structural elements. Each example is provided by way of explanation, and not as a limitation. In fact, it will be apparent to those skilled in the art that modifications and variations can be made without departing from the scope or spirit of the disclosure and claims. For instance, features illustrated or described as part of one embodiment may be used on another embodiment to yield a still further embodiment. Thus, it is intended that the present disclosure includes modifications and variations as come within the scope of the appended claims and their equivalents.

In general, the present disclosure is directed to a processing system for processing wafer-shaped objects, such as semiconductor wafers. The wafers are processed in a thermal processing chamber. In particular, the thermal processing chamber is designed to process two wafers at the same time. In accordance with the present disclosure, the thermal processing chamber is configured to hold the wafers such that the wafers are oriented in a face-to-face arrangement or in a back-to-back arrangement within the chamber during processing.

During thermal processing, for instance, one side of the wafer can be considered the "working side" while the other side of the wafer can be considered the "back side". As used herein, the "working side" of the wafer refers to the side of the wafer that is intended to undergo chemical and/or physical transformations during processing. For instance, the working side of the wafer is the side of the wafer where various coatings and other materials are deposited and/or removed to form electronic devices. The wafer processes that may be carried out on the working side include chemical vapor deposition, annealing, etching, plasma deposition, oxidation, nitridation, silicide formation, and the like. The back side of the wafer, on the other hand, is typically not intentionally subjected to the above types of processes. However, in some embodiments, it may be desirable to coat the back side of the wafer with one or more coatings.

The present inventors have discovered that various benefits and advantages can be obtained by processing two wafers together in a thermal processing chamber in a face-to-face relationship or in a back-to-back configuration. For instance, it is believed that greater temperature uniformity may be achieved between the two wafers in a face-to-face or a back-to-back configuration. In particular, by having similar surfaces face each other, a substantially isothermal and hot wall-like environment is produced within the thermal processing chamber greatly reducing temperature non-uniformities, especially temperature irregularities that sometimes exist when patterns are present on the surfaces of the wafers.

In addition, the heating of the two wafers together creates a symmetrical environment. In particular, as will be described in greater detail below, the chamber can be surrounded on both sides with a heating device such as a plurality of heating lamps. When two wafers are placed in the chamber in a face-to-face or back-to-back configuration, essentially the same surface of each wafer is facing a similar heating source. Such a configuration is also believed to further enhance the ability of the process to heat the wafers uniformly. Ultimately, the process and system of the present disclosure is capable of heating and processing wafer-shaped objects uniformly and rapidly. In particular, the process and system is capable of high throughput with improved temperature uniformity.

Referring to FIG. 1, one embodiment of a thermal processing system made in accordance with the present disclosure is shown. The system includes a processing chamber 12 adapted to receive a plurality of wafer-shaped objects. In this embodiment, for instance, the processing chamber 12 is configured to simultaneously process two semiconductor wafers 14 and 15. In general, any suitable object may be processed in the thermal processing chamber 12. When forming electronic circuitry, however, the objects can be wafers 14 and 15 as shown in FIG. 1A. The wafers can be made from any suitable material, such as silicon. The wafers, for instance, can have a diameter of from about 100 mm to about 500 mm or larger.

In addition to semiconductor wafers, it should be understood that various other objects may be processed in the thermal processing chamber 12. For instance, in one embodiment, flat panel displays for solar cells may be treated within the thermal processing chamber. The flat panel displays, for instance, can have dimensions even larger than 500 mm.

The wafers 14 and 15 can be placed in the thermal processing chamber 12 for various purposes. For instance, the wafers 14 and 15 can be placed in the thermal processing chamber in order to anneal the wafers, form coatings on the wafers, etch the wafers, and the like. When forming a coating on the wafers or etching the wafers, a gas or plasma may be circulated through the processing chamber 12.

As illustrated in FIG. 1A, the first semiconductor wafer 14 is positioned on a first substrate holder 16 while the second semiconductor wafer 15 is held on a second substrate holder 17. In accordance with the present disclosure, the substrate holders 16 and 17 are configured to hold the wafers 14 and 15 such that the wafers are in a face-to-face or back-to-back relationship. In particular, the wafers are placed in the thermal processing chamber 12 such that the working side of wafer 14 faces the working side of wafer 15 or, alternatively, the back side of wafer 14 faces the back side of wafer 15. The thermal processing chamber 12 is designed to heat the wafers 14 and 15 at very rapid rates and under carefully controlled conditions. Temperature uniformity of the wafers being heated is enhanced by having the wafers in the configuration as shown.

The substrate holders 16 and 17 can be configured to hold the semiconductor wafers 14 and 15 at a desired distance apart. For example, in one embodiment, the wafers may be held relatively close together. In this embodiment, for instance, the wafers 14 and 15 may be spaced less than about 5 mm apart, such as from about 0.5 mm to about 4 mm apart. By having the wafers spaced relatively close together, the wafers may tend to heat each other by thermal conduction during a thermal process. Coupling the wafers together thermally during processing may increase heating rates and prevent temperature fluctuations within the wafers.

In other embodiments, however, it may be desirable to space the wafers further apart. For instance, the wafers may be spaced greater than 4 mm apart, such as from about 4 mm to about 5 cm apart, such as from about 1 cm to about 3 cm apart.

The thermal processing chamber 12 can be made from various materials, including metals and ceramics. For instance, the thermal processing chamber 12 can be made from stainless steel, quartz, or mixtures thereof. If the chamber 12 is made from materials that are conductive, such as metals, in one embodiment, the chamber may be placed in communication with some type of cooling system for maintaining the walls at cooler temperatures when desired.

If desired, the thermal processing chamber 12 can also include a gas inlet and a gas outlet for introducing a gas into the chamber and/or for maintaining the chamber within a preset pressure range. In one embodiment, for instance, a gas inlet can be positioned within the chamber 12 so that a gas flows in between the two wafers, especially when the working side of each wafer faces each other. The gas inlet can include, for instance, a spray nozzle or shower head that defines a plurality of openings. The spray nozzle may be configured to evenly distribute a gas across the surfaces of both wafers 14 and 15.

By having the wafers 14 and 15 face each other, some efficiencies may be realized when introducing a gas into the chamber 12. For instance, the wafers, when facing each other form a contained area in which gases can be introduced for reaction with the surfaces of the wafers. For instance, in one embodiment, a gas inlet can be positioned within the chamber 12 and can be configured so that at least 20% of the gas flow, or such as at least 40% of the gas flow, or such as at least 60% of the gas flow is directed in between the wafers positioned on the opposing substrate holders 16 and 17.

In addition to gases that react with the wafers 14 and 15, alternatively inert gases can be fed through the chamber if desired. Inert gases may be fed into the chamber in order to prevent any unwanted or undesirable side reactions from occurring. As also described above, gases can be introduced into the chamber in order to pressurize the chamber or can be evacuated in order to create a vacuum within the chamber.

In still another embodiment, gas may be directed through the thermal processing chamber 12 in order to cool the wafers. For instance, a cooling gas may be introduced into the processing chamber 12 and directed in between the two wafers 14 and 15 for cooling the wafers. Alternatively, the cooling gas can be directed so as to primarily impinge on the outward-facing surfaces of the wafers for cooling the wafers. In still another embodiment, a cooling gas may flow below and above the wafers in the processing chamber.

During processing, in one embodiment, the substrate holders 16 and 17 can be adapted to rotate the wafers 14 and 15, if desired. Rotating the wafers, for instance, may promote greater temperature uniformity over the surface of the wafers and may promote enhanced contact between the wafers 14 and 15 and any gases introduced into the chamber.

As shown in FIG. 1A, for instance, the system can include a first wafer rotation mechanism 18 and a second wafer rotation mechanism 20. As shown, the first wafer rotation mechanism 18 is for rotating the substrate holder 16 and thereby rotating the wafer 14. The second wafer rotation mechanism 20, on the other hand, is for rotating the substrate holder 17 and the wafer 15. The wafer rotation mechanisms 18 and 20 can be configured to rotate the wafers 14 and 15 in the same direction or in opposite directions. Rotating the wafers in opposite directions may provide the advantage of making it easier to flow gas into the space between wafers and may promote gas mixing there. It also prevents any patterns on the surfaces of the wafers from being consistently aligned with each other and hence may further improve temperature uniformity across the wafers. In some cases it may also be useful to only rotate one of the wafers. As shown in FIG. 1A, the wafer rotation mechanism 18 is positioned above the wafer 14, while the wafer rotation mechanism 20 is positioned below the wafer 15. In this manner, the wafers can be rotated without having to place any equipment or mechanism in between the opposing surfaces of the wafers. Thus, a clear space is provided between the wafers for process gases or for positioning other equipment.

In the embodiment illustrated in FIG. 1A, two different wafer rotation mechanisms are used for rotating each wafer individually. In an alternative embodiment, however, a single wafer rotation mechanism may be included in the chamber for rotating both wafers together. Any suitable wafer rotation mechanism may be used in the system of the present disclosure. In the embodiment illustrated in FIG. 1A, for instance, a mechanical system is shown. In other embodiments, however, the wafer rotation mechanism may be gas driven or may be electromagnetically driven.

In order to heat the semiconductor wafers 14 and 15 during processing, the thermal processing chamber 12 can be in communication with one or more heating devices. For instance, in the embodiment shown in FIG. 1A, the thermal processing chamber 12 is in communication with a first heating device 22 positioned over the top of the chamber 12 and a second heating device 24 positioned along the bottom of the chamber 12. In this embodiment, the first heating device 22 and the second heating device 24 comprise a plurality of radiant energy sources, such as lamps 26. Any suitable lamp may be used to heat the wafers 14 and 15. For instance, the lamps 26 may comprise tungsten-halogen lamps, arc lamps, lasers, laser diodes, infrared lamps, combinations thereof, and the like.

The use of radiant energy sources, such as lamps 26 may provide various advantages and benefits depending upon the application. For instance, lamps have much higher heating and cooling rates than other heating devices, such as electrical elements or conventional furnaces. The lamps 26 create a rapid processing system that provides instantaneous energy, typically requiring a very short and well controlled start up period. The flow of energy from the lamps 26 can also be abruptly stopped at any time. As shown in FIG. 1A, each heating device 22 and 24 can be connected to a gradual power controller 28. The power controller 28 can be used to increase or decrease the radiant energy being emitted by the lamps.

Figure 5:
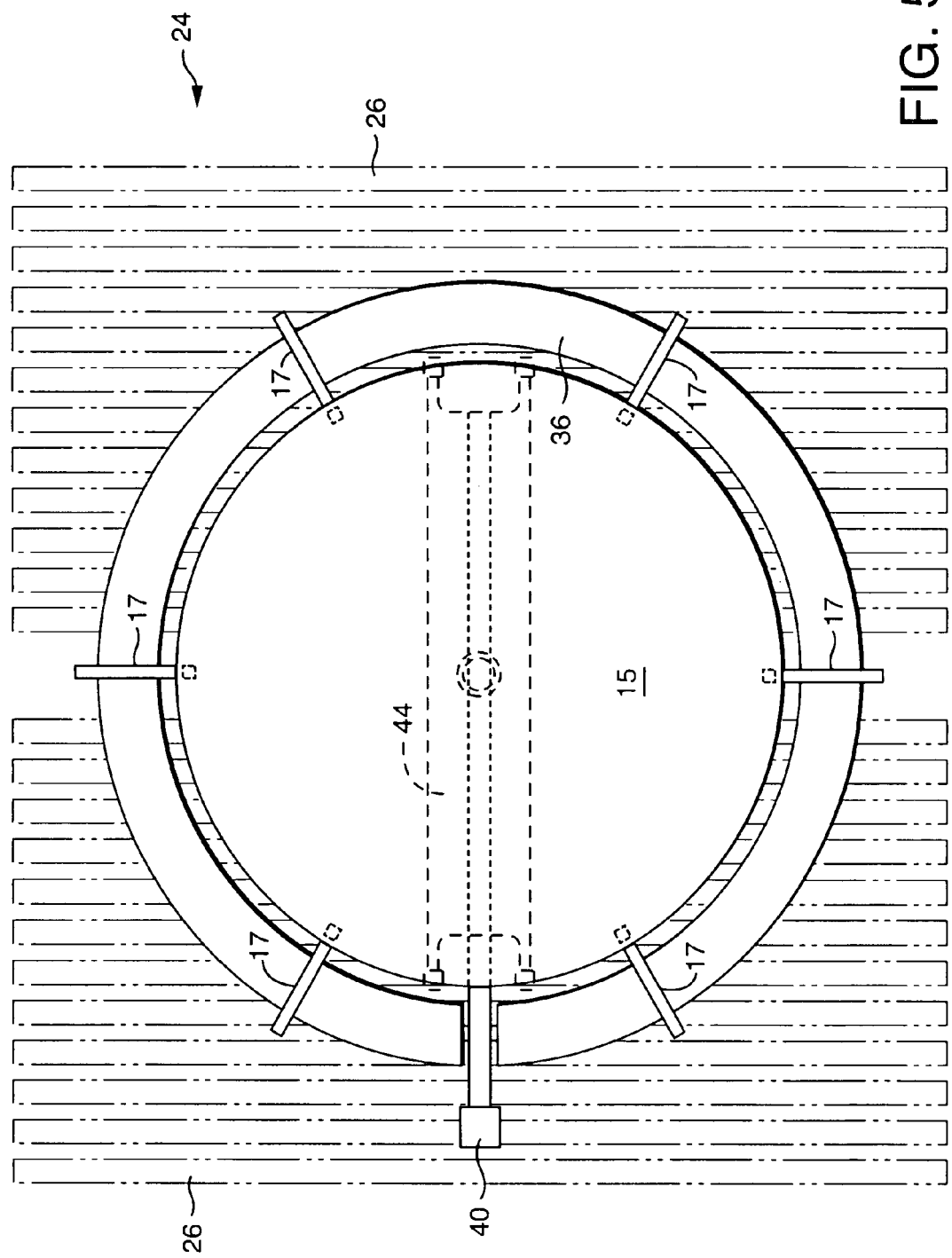
FIG. 5 is a plan view of the thermal processing chamber illustrated in FIG. 3.

The lamps that are used in the system of the present disclosure can have various shapes and can be positioned in various different configurations surrounding the thermal processing chamber. For example, in one embodiment, the lamps may have an elongated tubular housing that is positioned such that the elongated housing faces the thermal processing chamber. For instance, horizontally oriented lamps having long tubular housings are shown in FIG. 1A and particularly in FIG. 5. FIG. 5, for instance, is a cross-sectional view of the thermal processing chamber shown in FIG. 1A. FIG. 5 illustrates the heating device 24 comprising a plurality of lamps 26 positioned below the thermal processing chamber for heating the semiconductor wafer 15.

Besides lamps having an elongated housing, shorter upright lamps may also be used. An upright lamp refers to a shorter lamp having a free open end opposite an end that is adapted to be placed into a socket. When incorporated into the system of the present disclosure, such lamps can be positioned such that the open free end faces the thermal processing chamber and any wafers contained in the chamber. Such lamps, for instance, can be vertically oriented when placed above and below the thermal processing chamber 12. Such lamps can include, for instance, arc lamps.

When using lamps to heat the semiconductor wafers, the lamps can be separated from the interior of the thermal processing chamber 12 while still be capable of heating the semiconductor wafers 14 and 15. For instance, as shown in FIG. 1A, the thermal processing chamber 12 can include a top window 30 that separates the lamps 26 from the thermal processing chamber 12. Similarly, the system can include a bottom window 32 that separates the second bank of lamps 24 from the thermal processing chamber. The windows 30 and 32 can comprise the entire top and bottom of the chamber or can have a circular shape and only occupy a portion of the top or bottom of the chamber. The windows 30 and 32 can be made from a transparent material that allows radiant energy being emitted by the lamps 26 to heat the wafers 14 and 15, while creating a sealed chamber in order to prevent the wafers from being contaminated by the lamps or from any other source.

In one embodiment, the windows 30 and 32 can also act as a filter in preventing thermal radiation being emitted by the lamps 26 at a certain wavelength from entering the thermal processing chamber. For instance, as will be described in greater detail below, light at a certain wavelength may interfere with temperature measurement devices within the chamber. In this embodiment, the windows can be made from fused silica or quartz. Fused silica is known to absorb thermal radiation very effectively at selected wavelengths. For instance, fused silica with a high concentration of hydroxy ions is very effective at absorbing light at a wavelength of from approximately 2.7 micrometers to about 2.8 micrometers.

As shown in FIG. 1A, by having a heating device at the top of the thermal processing chamber and by having a separate heating device at the bottom of the thermal processing chamber, a symmetrical heating system is created. Having the wafers 14 and 15 in a face-to-face or back-to-back configuration also serves to create a symmetrical heating arrangement that is very well adapted to heating the wafers uniformly.

It should be understood, however, that in addition to lamps 26, various other heating devices may be incorporated into the thermal processing chamber 12. For instance, in other embodiments, the wafers may be heated using an electrical resistance heater, an RF heating device, or the like. These heating devices may be used alone or in combination with the lamps 26.

During heating of the semiconductor wafers 14 and 15, it is known that the wafers tend to experience heat loss through their edges. This heat loss can create temperature non-uniformities within the wafer and thus create undesired stress. In order to compensate for heat loss through the edges, in one embodiment, the system of the present disclosure can include slip free rings 34 and 36 as shown in FIG. 1A that at least partially encircle the semiconductor wafers 14 and 15. The slip free rings 34 and 36, for instance, can be made from a material capable of absorbing thermal radiation and thereby elevating in temperature during thermal processing. For instance, in one embodiment, the slip free rings 34 and 36 can be made from silicon. In an alternative embodiment, the slip free rings can be made from silicon carbide. In still another embodiment, the slip free rings can be made from a heavily doped material, such as heavily doped silicon. When heavily doped, for instance, the slip free rings can have a resistivity of less than 0.1 $\Omega cm$.

As shown in FIG. 1A, the first slip free ring 34 is positioned generally in the same plane as the first semiconductor wafer 14. Similarly, the second slip free ring 36 is generally positioned in the same place as the second semiconductor wafer 15. A plan view of the slip free ring 36 is also shown in FIG. 5. As shown, the slip free ring substantially surrounds the circumference of the wafer 15.

The thickness of the slip free rings 34 and 36 can vary depending upon various factors including the type of heating device that is used to heat the wafers and the type of material that is used to construct the slip free rings. In general, the slip free rings can have a thickness that is from about 50% to about 200% of the thickness of the semiconductor wafer that the slip free surrounds. For most embodiments, for instance, the slip free rings can have a thickness of from about 0.5 mm to about 2 mm, such as from about 0.6 mm to about 1.2 mm.

In the embodiment as illustrated in FIG. 1A, the slip free rings 34 and 36 are positioned adjacent to but do not contact the semiconductor wafers 14 and 15. In an alternative embodiment, however, the slip free rings 34 and 36 can be designed to actually hold the semiconductor wafers within the chamber. In this embodiment, the slip free rings have a dual purpose in that they act as support structures and also compensate for heat loss out of the edges of the wafers.

Figure 2:
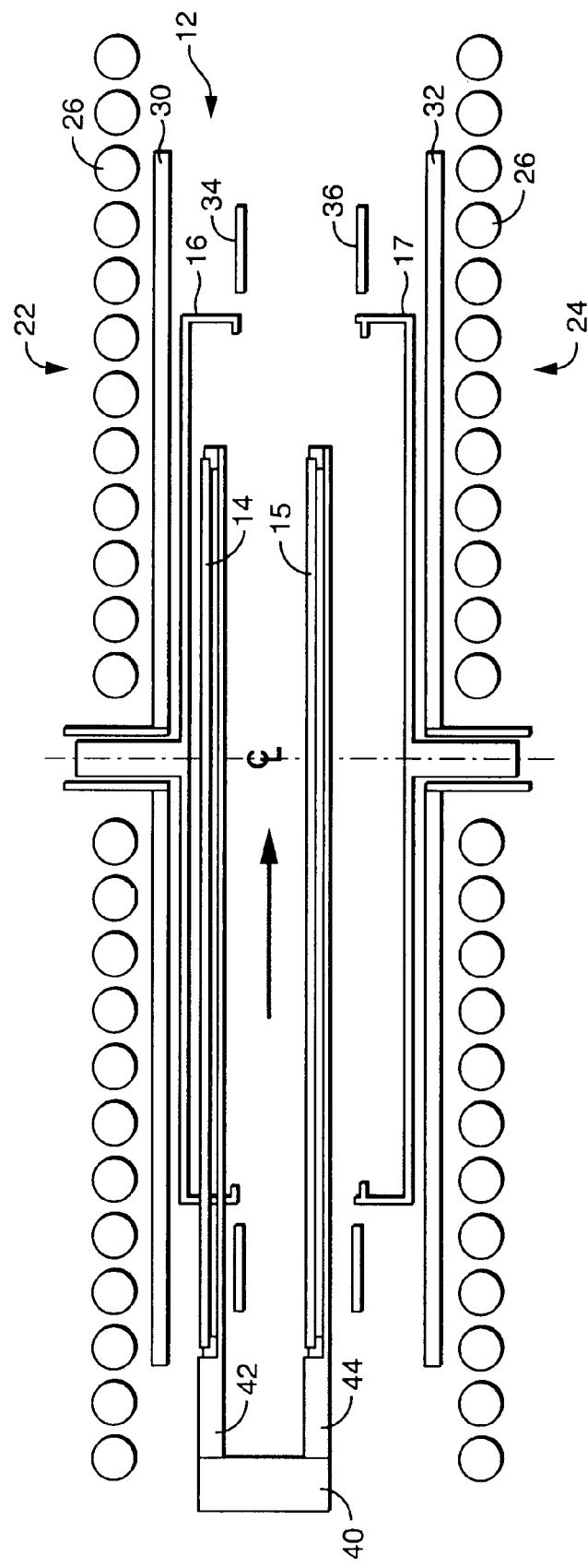
FIGS. 2 and 3 are cross-sectional views of the thermal processing chamber illustrated in FIG. 1A illustrating the loading of two wafer-shaped objects.
Figure 3:
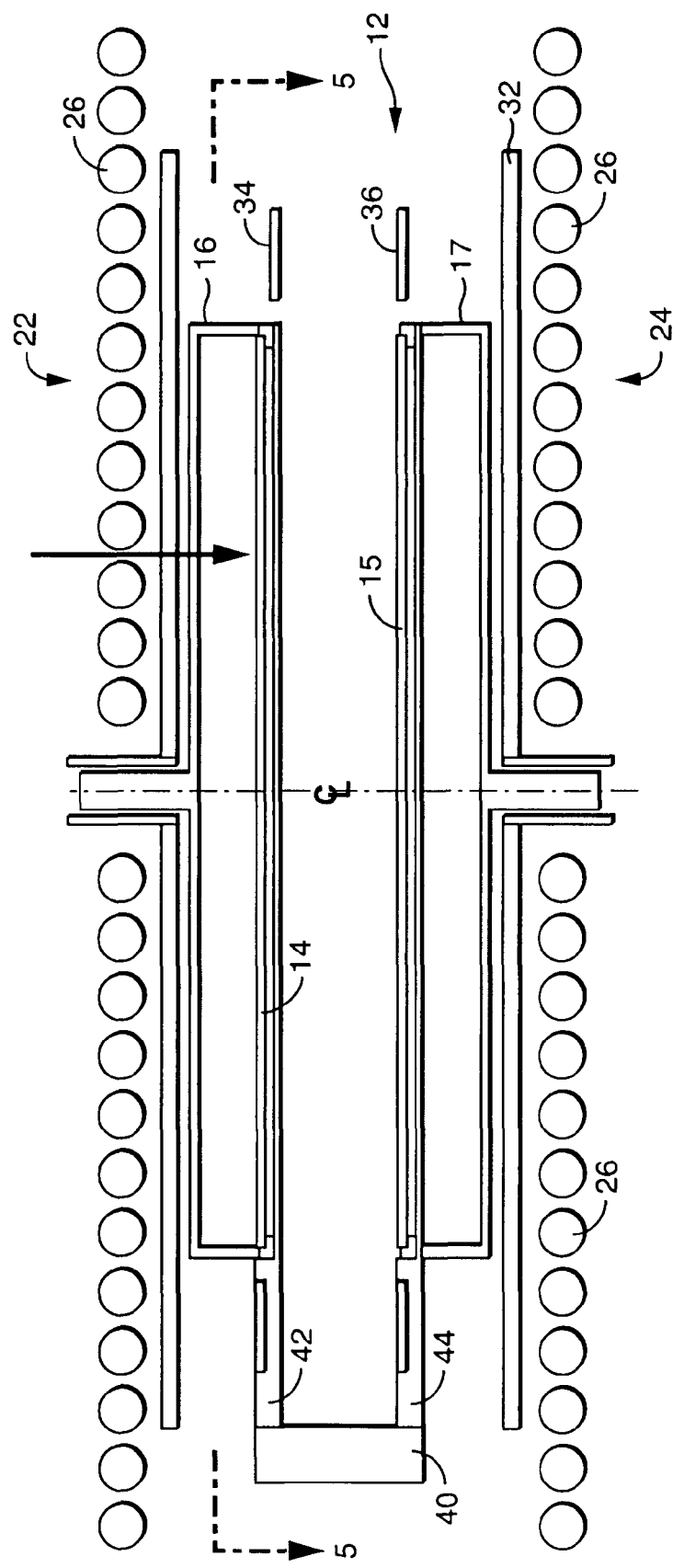

In order to load and unload wafers into the thermal processing chamber 12, various different configurations can be used as desired. One embodiment, for instance, of a method for loading and unloading wafers into and out of the thermal processing chamber 12 is illustrated in FIGS. 2 and 3. As shown, in this embodiment, an endeffector 40 includes a first arm 42 and a second arm 44 for holding the semiconductor wafers 14 and 15. The endeffector 40 may be attached to, for instance, a robotic arm capable of picking up a pair of wafers from a cassette and then loading the wafers into the chamber 12. Referring to FIG. 5, for instance, the arm 44 of the endeffector 40 is shown placing the semiconductor wafer 15 onto the substrate holder 17. In this embodiment as shown in FIGS. 2 and 3, the endeffector enters the thermal processing chamber 12 and then in a downward motion lowers the semiconductor wafers 14 and 15 onto the respective substrate holders 16 and 17.

In an alternative embodiment, the endeffector 40 may be configured to only hold one semiconductor wafer at a time. In this embodiment, only one wafer at a time is loaded into the thermal processing chamber 12.

In still another embodiment, the system of the present disclosure may include two endeffectors that are each attached to a corresponding robot arm. Both robot arms may work in conjunction in moving the wafers in and out of the processing chamber. In one embodiment, for instance, one of the robotic arms may be configured to remove a wafer from a cassette and then invert the wafer prior to loading the wafer into the thermal processing chamber 12. In this manner, the wafer can be placed in the chamber in a face-to-face or back-to-back arrangement.

In still another embodiment, the substrate holders 16 and 17 may be moveable within the thermal processing chamber 12 in order to facilitate loading and unloading of the wafers. For instance, the substrate holders may move up or down in order to allow wafers to be loaded onto the substrate holder without interference from the slip free rings. For instance, the rotation mechanisms 18 and 20 may also be configured to move the substrate holders in a vertical motion. In still another embodiment, the slip free rings 34 and 36 may move during loading and unloading of the wafers. For instance, in one embodiment, the slip free rings may tilt downwardly or upwardly so as to not interfere with the placement of the wafers on the substrate holders.

In still another embodiment of the present disclosure, the substrate holders 16 and 17 and/or the slip free rings 34 and 36 may move in and out of the thermal processing chamber 12 with the wafers 14 and 15. For instance, the substrate holders 16 and 17 alone or in conjunction with the slip free rings 34 and 36 may form a tray that is moved out of the processing chamber. Once taken out of the processing chamber, an endeffector may be used to load a wafer onto the tray from a cassette. As described above, one of the wafers may be inverted prior to being loaded onto the tray. Once the trays are loaded, then the substrate holders and/or slip free rings may be moved into the thermal processing chamber as a single unit and properly positioned for processing.

In order to monitor the temperature of the wafers 14 and 15 during the heating process, in one embodiment, the system of the present disclosure can include one or more radiation sensing devices. For instance, as shown in FIG. 1A and FIG. 6, the system includes a radiation sensing device 50 which may be, for instance, a pyrometer. As shown, the pyrometer 50 is in communication with light pipes 52 and 54. The light pipes 52 and 54 may comprise any suitable optical sensor, optical fiber, or light pipe. The light pipes 52 and 54 are configured to receive thermal energy being emitted by the wafers 14 and 15 at a particular wavelength. The amount of sensed radiation is then communicated to the pyrometer 50 which generates a usable voltage signal for determining the temperature of the wafers which can be calculated, for example, based on Planck's Law. In the embodiment illustrated in FIG. 1A, the light pipes 52 and 54 are routed to a single but multiplexing radiation sensing device 50. In an alternative embodiment, however, each light pipe 52 and 54 may be in communication with a separate radiation sensing device.

In general, the thermal processing system of the present disclosure can contain one or a plurality of radiation sensing devices. The radiation sensing devices or pyrometers measure the temperature of the wafer. Knowing the temperature of the wafers can then be used to control the amount of heat being applied to the wafers.

For example, as shown in FIG. 1A, the system can include a controller 56. The controller 56 can comprise one or more suitable programmable devices, such as a microprocessor. Controller 56 is configured to receive voltage signals from the pyrometer 50 that represent the radiation amounts being sampled at the various locations. The controller 56, based upon the signals received, can be configured to calculate the temperature of the wafers 14 and 15. As shown, the system controller 56 is also in communication with the power controller 28. Based upon the information received from the pyrometer 50, the system controller 56 can in turn control the amount of thermal energy being emitted by the lamps 26. For instance, the controller 56 can control all the lamps together, can individually control the lamps, or can control the lamps in selected groups. In this manner, instantaneous adjustments can be made regarding the conditions within the thermal processing chamber 12 for processing the wafers 14 and 15 within carefully controlled limits.

The controller 56, for instance, can control the heating devices 22 and 24 for heating the wafers 14 and 15 according to a certain and desired time-temperature cycle. The controller, for instance, may control the heating devices in an open loop configuration. In an open loop configuration, the controller is pre-programmed to increase the power to the lamps in a certain manner.

Alternatively, the system controller 56 may control the heating devices in a closed loop configuration. In this embodiment, the system controller can, based on information received from one or more pyrometers, instantaneously changes the amount of power delivered to the lamps for heating the wafers according to a desired temperature-time trajectory.

In one embodiment, a model based controller can be used that controls the heating devices 22 and 24 for heating the wafers. A model based controller can control the process within the processing chamber based on an understanding of the heat transfer characteristics of the equipment. A model based controller, for instance, can include a control algorithm that can predict the response of the wafer temperature distributions based upon the power applied to the heating devices. The model based controller, for instance, can be programmed with a physical model that takes account of heat transfer processes that occur within the processing chamber. The model based controller can produce an output based on a preprogrammed model alone or can produce an output that takes into account information received from one or more temperature sensing devices.

During processing, the system controller 56 can also be used to automatically control other elements within the system. For instance, the controller 56 can be used to control the flow of gases entering and exiting the chamber 12. The controller 56 as shown in FIG. 1A can also be in communication with the wafer rotation mechanisms 18 and 20 for rotating the wafers at desired times and according to desired speeds.

The manner in which the temperature of the wafers 14 and 15 are monitored during processing can vary depending upon the particular application. In the embodiments illustrated in FIGS. 1A and 6, for instance, a sensor is placed in between the two wafers for sensing the amount of thermal radiation being emitted by the wafers. As described above, the sensors 52 and 54 are generally configured to sense thermal radiation being emitted by the wafers at a particular wavelength. Placing the sensors in between the two wafers may provide various advantages and benefits. For example, by placing the sensors in the cavity between the wafers, the sensors are configured to collect thermal radiation being emitted by the wafers without also collecting stray light that may be emitted by the lamps. For instance, the wafers themselves provide a shield that separates the sensors 52 and 54 from the first and second heating devices 22 and 24 for minimizing the amount of stray light being emitted by the lamps that may be sensed by the sensors.

Placing the sensors in the cavity between the wafers may also reduce the sensitivity of the measurement to the emissivity of the wafers. For instance, as shown in FIGS. 1A and 6, the wafers are being heated from above and below in a symmetrical configuration. The wafers 14 and 15 should be at very similar temperatures during heating. Thus, the cavity in between the wafers during processing should be nearly isothermal and energy fluxes within should mimic black-body radiation conditions. In this manner, the problems associated with fluctuating emissivity of the wafers' surfaces may be greatly reduced. Furthermore, each wafer will tend to shield the sensors from stray light emitted by the heat sources within the wavelength range sensed by the pyrometers.

Placing the sensors 52 and 54 in the cavity between the wafers may also allow for various other measurements. For example, at lower temperatures, semiconductor wafers are semi-transparent at wavelengths in the infra-red. Having the sensors positioned in between the wafers, however, allows for low temperature measurements of the wafer. In particular, low temperature measurements of each wafer may be conducted by sensing radiation being emitted by the wafers at relatively short wavelengths. For example, for silicon wafers, the radiation being sampled may be at a wavelength of less than about 1.1 microns. At short wavelengths, the wafers are opaque even at relatively low temperatures and each wafer may serve as a shield to greatly reduce stray light.

In addition to temperature measurements, various other measurements may be taken within the thermal processing chamber depending upon the particular application. For example, in one embodiment, sensors and other equipment may be placed in association with the thermal processing chamber for measuring the transmittance and reflectance of the wafers. For instance, a determined amount of light may be directed onto the wafer from an opposite side of a sensor for measuring transmittance, especially at lower temperatures. Such measurements may be used to improve the accuracy of temperature reading from radiation pyrometry, but they can also be used to measure the optical properties of the wafer. The optical properties of the wafer provide another approach for temperature measurement or calibration, as described in U.S. Patent Application Publication No. 2003/0236642, which is incorporated herein by reference. Transmittance and reflectance measurements can also be taken prior to processing in order to get emissivity estimates of the two wafer surfaces. The emissivity estimates can increase the accuracy of temperature measurements during processing where the two wafers aren't exactly at the same temperature.

The configuration of the present disclosure is particularly well suited for measuring the transmittance of the wafers, especially when no equipment or other devices are positioned in between the wafers.

Reflectance measurements, on the other hand, can be taken by shining a known amount of light in between the two wafers and sensing the amount of light that is reflected off the surfaces of the wafers. Reflectance measurements can be made using any suitable reflectometer and can be performed by shining light on either of the surfaces of either of the wafers, so that the reflectance of any of the wafers' surfaces can be measured.

Referring to FIG. 7, another alternative embodiment of a system for processing wafers in accordance with the present disclosure is shown. Like reference numerals have been used to indicate similar elements. In the configuration shown in FIG. 7, instead of using a single pyrometer to measure the temperature of each wafer 14 or 15, a plurality of pyrometers are used. For instance, sensors 60 and 62 are configured to sense the amount of thermal radiation being emitted by the semiconductor wafer 14. Sensors 64 and 66, on the other hand, are configured to sense the amount of thermal radiation being emitted by the semiconductor wafer 15. The sensors 60 and 64 are in communication with one or more pyrometers 68, while the sensors 62 and 66 are in communication with one or more pyrometers 70. Taking radiation measurements at more than one location on each wafer 14 and 15 may improve the accuracy of the process.

In one embodiment, for instance, the sensor 60 may be configured to sense the amount of radiation being emitted by the wafer 14 at a center region of the wafer, while the sensor 62 can be configured to sense the amount of thermal radiation being emitted by the wafer at an edge region. The two readings can be used to determine a overall temperature profile of the wafer and to determine whether or not the wafer is being heated uniformly. In one embodiment a controlled algorithm can be used and programmed into the controller for optimizing the dynamic temperature uniformity for both wafers based upon the multiple measurements.

When the sensors are positioned in between the two wafers as shown in FIGS. 1A, 6 and 7, the sensors can be in communication with corresponding pyrometers using any suitable configuration. In one embodiment, for instance, the sensors may be configured to rotate with the wafers. Alternatively, the sensors may be held stationary while the wafers rotate.

Figure 8:
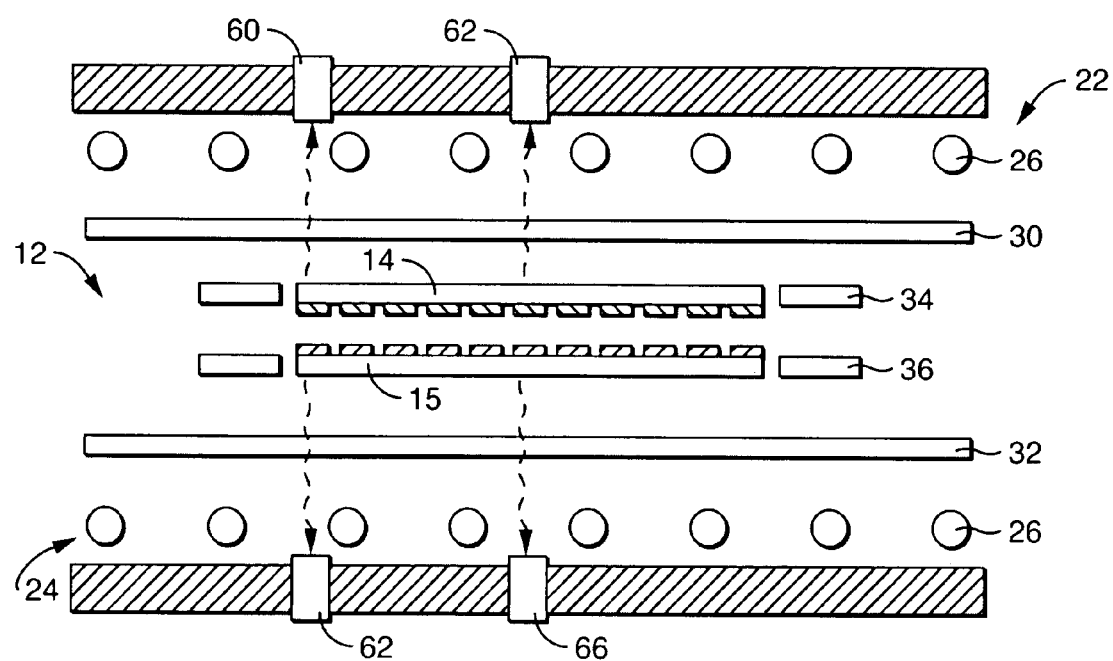
FIG. 8 is a cross-sectional view of another embodiment of a thermal processing chamber made in accordance with the present disclosure.

Referring to FIG. 8, another embodiment of a thermal processing system made in accordance with the present disclosure is shown. Again, like reference numerals have been used to indicate similar elements. In the embodiment illustrated in FIG. 8, similar to the embodiment illustrated in FIG. 7, each wafer is placed in communication with two sensors. For instance, sensors 60 and 62 are positioned to sense the amount of radiation being emitted by the wafer 14, while the sensors 64 and 66 are configured to measure the amount of radiation being emitted by the wafer 15. In FIG. 8, however, instead of being positioned in between the two wafers, the sensors are positioned outside of the chamber 12 and sense the amount of thermal radiation being emitted by the back side of the wafers. As shown, one sensor is positioned to sense the amount of thermal radiation being emitted by a center region of the wafer, while the other sensor is positioned to sense the amount of thermal radiation being emitted by an edge region of the wafer. Each of the sensors may be in communication with a separate pyrometer. The configuration in FIG. 8 may be a less complicated design in relation to the embodiment shown in FIG. 7.

In still another embodiment of the present disclosure, light pipes or other sensors may be positioned in between the two wafers and also may be positioned to sense thermal radiation on the opposite side of the wafers. Thus, the configurations illustrated in FIGS. 7 and 8 may be combined for providing even further information about the wafers. Further, pyrometers positioned in between the two wafers may be used to calibrate pyrometers that sense the back side of the wafers and vice versa.

In still another embodiment of the present disclosure, the system may only include a single pyrometer. In this embodiment, the pyrometer may be in communication with a light pipe positioned in between the two wafers. In this scenario, one might assume that the wafers are at the same temperature due to the isothermal processing configuration. Thus, only a single pyrometer may be needed in order to monitor the temperature of both wafers.

Referring back to FIG. 1A, as described above, the semiconductor wafer 14 is held by the substrate holder 16, while the semiconductor substrate 15 is held by the substrate holder 17. In this embodiment, the substrate holder 16 extends from the top of the chamber for holding the wafer 14. The substrate holder 17, on the other hand, extends from the bottom of the chamber for holding the substrate 15. The substrate holders 16 and 17 are in a symmetrical configuration for holding the wafers in a face-to-face or back-to-back arrangement.

Instead of extending from the top and bottom of the chamber, however, in other embodiments, the substrate holders 16 and 17 may extend from the sides of the chamber. For instance, other substrate holder configurations are shown in FIG. 1B and FIG. 1C.

Figure 1B:
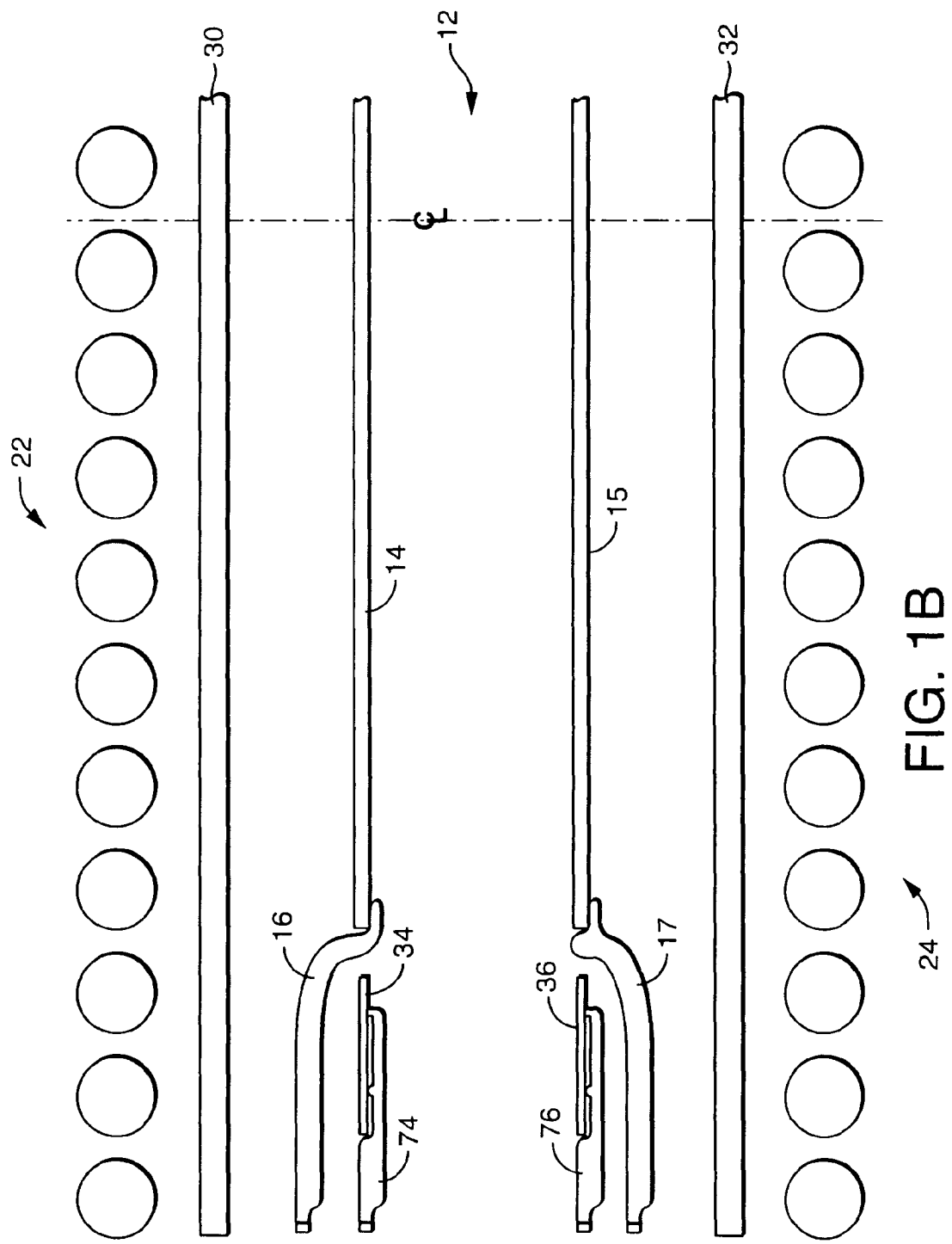
FIG. 1B is a cross-sectional view with cut away portions of one embodiment of a thermal processing system made in accordance with the present disclosure.

As shown in FIG. 1B, a substrate holder 16 extends from the side of the chamber for supporting the semiconductor wafer 14, while a somewhat symmetrical substrate holder 17 also extends from the side of the chamber for supporting the semiconductor wafer 15. In addition, the system can include a separate ring holder 74 for holding the slip free ring 34 and a ring holder 76 for holding the slip free ring 36. The ring holders 74 and 76 can also be attached to the side of the chamber. A rotation mechanism may be in communication with the substrate holders 16 and 17. The rotation mechanism may also be configured to rotate the ring holders 74 and 76 if desired. As also shown in FIG. 1B, the substrate holder 16 generally angles downwardly within the chamber to hold the wafer 14, while the substrate holder 17 generally angles upwardly in the chamber to hold the wafer 15. In this manner, the substrate holders provide little interference during processing.

Figure 1C:
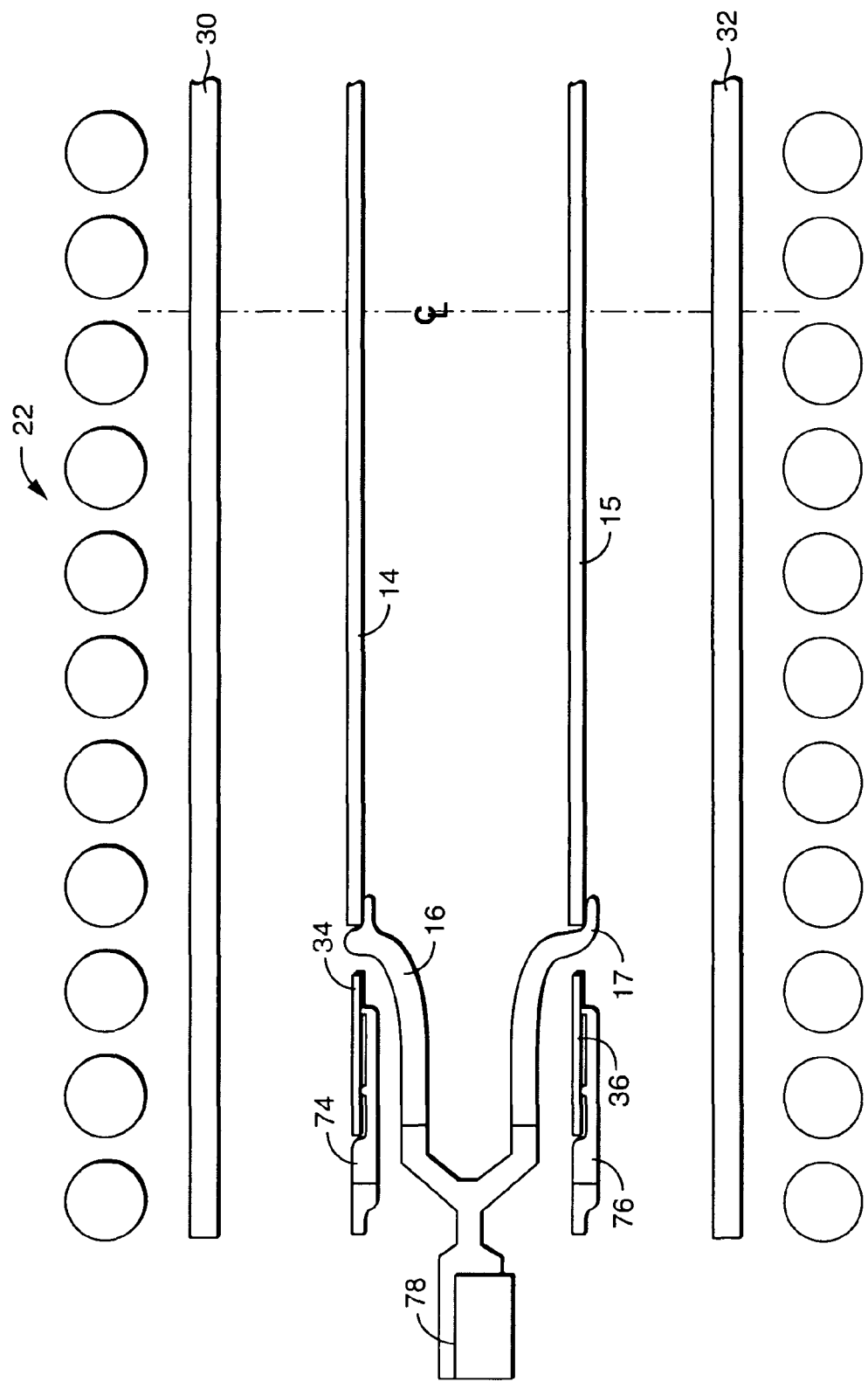
FIG. 1C is a cross-sectional view with cut away portions of another embodiment of a thermal processing chamber made in accordance with the present disclosure.

Referring to FIG. 1C, still another embodiment of a configuration for holding the wafers 14 and 15 is shown. In this embodiment, the substrate holder 16 is attached to the substrate holder 17 to form an attachment member 78. In this embodiment, a single rotational mechanism can then be used to rotate both substrate holders.

The substrate holders 16 and 17 are designed to hold the wafers at the edge or near the edge. For instance, the substrate holders can be designed to hold the wafers so that only the wafer is contacted within an edge exclusion region. The edge exclusion region, for instance, can have a length at the outer most periphery of the wafer of less than about 5 mm, such as from about 0.5 mm to about 3 mm. In general, the substrate holders contact the wafers on at least three different locations. For instance, as shown in FIG. 5, the substrate holder 17 contacts the wafer at six different locations.

The substrate holders can be made from any suitable material. Materials that can be used to construct the substrate holders include, for instance, silica such as fused silica, clear or opaque quartz, sapphire, aluminum oxide, silicon nitride, yttrium aluminum garnet (YAG), yttria, zirconia, hafnia, aluminum oxynitride (AlON), silicon, silicon carbide, or mixtures thereof.

Figure 4A:
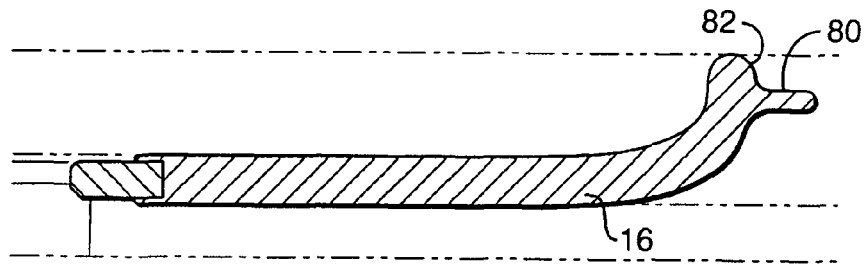
FIGS. 4A through 4E are cross-sectional views of various embodiments of substrate holders for holding wafer-shaped objects that maybe used in accordance with the present disclosure.

Referring to FIGS. 4A through 4E, various configurations of substrate holders are shown for holding the semiconductor wafers. FIG. 4A, for instance, illustrates an embodiment similar to the substrate holders shown in FIGS. 1B and 1C. As shown, the substrate holder 16 includes a ledge 80 that is configured to contact a semiconductor wafer. The substrate holder 16 can also include an abutment 82 for maintaining the wafer in the proper position.

Figure 4B:
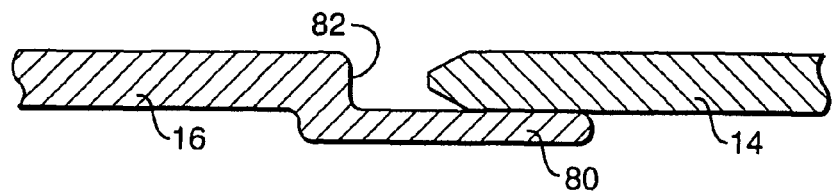
Figure 4C:
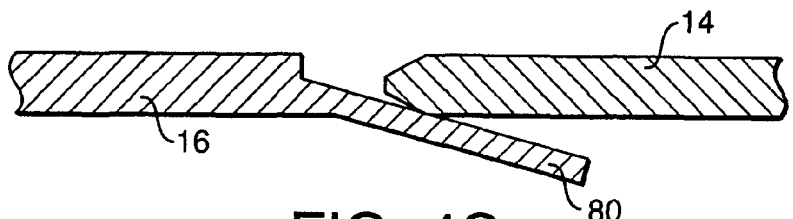
Figure 4D:
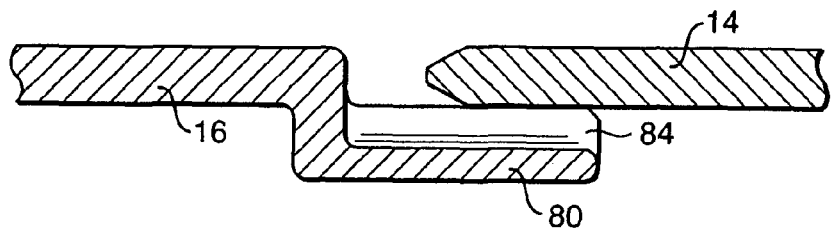

Referring to FIGS. 4B and 4D, another embodiment of a substrate holder 16 is shown. In this embodiment, the substrate holder 16 is more horizontally oriented than the embodiment shown in FIG. 4A. As shown, the substrate holder 16 includes a ledge 80 and an abutment 82 for holding a wafer 14.

In the embodiment shown in FIG. 4D, the ledge 80 has a "T" like shape. In particular, the ledge 80 includes a knife edge 84 that is designed to contact the semiconductor wafer 14. In this manner, less surface area is intended to contact the wafer.

Referring to FIG. 4C, still another embodiment of a substrate holder 16 that may be used in accordance with the present disclosure is shown. In this embodiment, the ledge 80 is angled defining an inclined surface for contact with the wafer 14. By having an inclined surface, the ledge 80 only contacts the wafer 14 at the edge of the wafer.

When using an inclined surface as shown in FIG. 4C or when using any of the other embodiments shown, the substrate holder 16 may be in the form of a ring that completely surrounds the wafer. Alternatively, as described above, substrate holder 16 may include from about 3 to about 8 contact points for supporting the wafer.

The angle of the inclined surface with respect to the horizontal may vary depending upon various factors. For instance, the angle may vary depending upon the shape of the wafer and the size of the wafer. The inclined surface of the ledge 80, for instance, may have an angle of from about 5° to about 60°, such as from about 10° to about 45°.

Figure 4E:
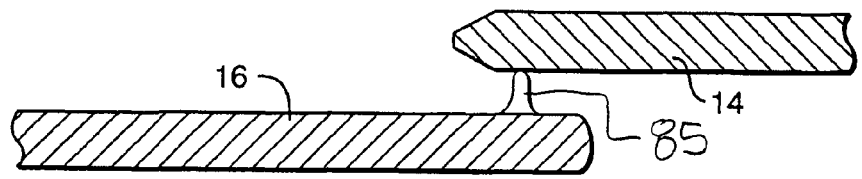

Referring to FIG. 4E, still another embodiment of a substrate holder 16 is illustrated. In this embodiment, the substrate holder 16 includes a pin 85 for supporting the semiconductor wafer 14. The pin can be positioned on the substrate holder 16 so as to only contact the wafer 14 in the edge exclusion region. In order to support the wafer 14, the substrate holder may include from about 3 to about 8 pins that are positioned around the circumference of the wafer. A robot arm designed to load the wafer 14 into the processing chamber can be configured to place the wafer in alignment with the pins 85.

Any of the embodiments shown in FIGS. 4A through 4E can also include a coating that is designed to contact the semiconductor wafer. The coating, for instance, may comprise a low friction material or can be made from a thermal insulator. In other embodiments, the coating may be made from the same material as the wafer so that the substrate holder does not interfere with the heating process or create temperature non-uniformities within the wafer. In still another embodiment, a diamond-like carbon coating can be used.

In addition to the substrate holders shown in the Figures, it should be understood that various other configurations are possible. For instance, in an alternative embodiment, the wafers may be supported in the thermal processing chamber by structures that emit jets of gas. In this embodiment, the wafers are supported and cushioned by a layer of gas. The gas may be used not only to support the wafers, but also to cool the wafers when desired. In one particular embodiment, one of the wafers may be supported by a Bernoulli-style gas-flow.

In some embodiments, it may be desirable to only process a single wafer in the thermal processing chamber 12. In this embodiment, according to the present disclosure, a dummy wafer may be placed in the chamber in conjunction with a wafer that is to undergo thermal processing. In this manner, a symmetrical heating arrangement may be maintained. Dummy wafers may also be used to calibrate any pyrometers used in the system. For instance, dummy wafers attached to thermocouples may be placed in the chamber for calibrating the pyrometers. In one embodiment, the wires attached to the thermocouples may face inward away from the lamps used to heat the wafers.

These and other modifications and variations to the present disclosure may be practiced by those of ordinary skill in the art, without departing from the spirit and scope of the present disclosure, which is more particularly set forth in the appended claims. In addition, it should be understood that aspects of the various embodiments may be interchanged either in whole or in part. Furthermore, those of ordinary skill in the art will appreciate that the foregoing description is by way of example only, and is not intended to limit the disclosure so further described in such appended claims.

What is claimed:

1. A method for thermally processing a plurality of wafer-shaped objects comprising:
   placing a first wafer-shaped object into a thermal processing chamber, the first wafer-shaped object having a diameter and having a first side and a second and opposite side, the first side comprising a working side configured to be modified while in the thermal processing chamber, the second side comprising a back side;
   placing a second wafer-shaped object into the thermal processing chamber, the second wafer-shaped object having a first side and a second and opposite side, the first side comprising a working side configured to be modified while in the thermal processing chamber, the second side comprising a back side, and wherein the second wafer-shaped object is placed in the thermal processing chamber spaced a distance from the first wafer-shaped object and such that the first side of the first wafer-shaped object faces the first side of the second wafer-shaped object or the second side of the first wafer-shaped object faces the second side of the second wafer-shaped object; and
   processing the first and second wafer-shaped objects in the thermal processing chamber by heating the objects.

2. A method as defined in claim 1, wherein the first side of the first wafer-shaped object and the first side of the second wafer-shaped object are facing each other during processing.

3. A method as defined in claim 1, wherein the second side of the first wafer-shaped object and the second side of the second wafer-shaped object are facing each other during processing.

4. A method as defined in claim 1, wherein the second wafer-shaped object has a diameter that is substantially similar to the diameter of the first wafer-shaped object.

5. A method as defined in claim 1, wherein both wafer-shaped objects are placed in the thermal processing chamber simultaneously.

6. A method as defined in claim 1, wherein the first and second wafer-shaped objects comprise semiconductor wafers.

7. A method as defined in claim 1, wherein a first temperature measuring device measures the temperature of the first wafer-shaped object and a second temperature measuring device measures the temperature of the second wafer-shaped object, the temperature measuring devices being in communication with a controller, the controller controlling a heating device for heating the wafer-shaped objects during processing.

8. A method as defined in claim 1, wherein the thermal processing chamber is in communication with a first heating device and a second heating device, the first and second wafer-shaped objects being positioned in between the first heating device and the second heating device.

9. A method as defined in claim 1, wherein the first wafer-shaped object and the second wafer-shaped object are horizontally oriented within the thermal processing chamber.

10. A method as defined in claim 1, wherein the surfaces of the wafer-shaped objects that are facing each other are substantially parallel to each other.

11. A method as defined in claim 1, wherein the first wafer-shaped object, when placed in the thermal processing chamber, is at least partially encircled by a first slip free ring and wherein the second wafer-shaped object, when placed in the thermal processing chamber, is at least partially encircled by a second slip free ring.

12. A method as defined in claim 1, wherein the first wafer-shaped object defines an edge exclusion region and the second wafer-shaped object also defines an edge exclusion region and wherein the first wafer-shaped object is supported in the thermal processing chamber on a first support structure, the first support structure supporting the first wafer-shaped object within the edge exclusion region and wherein the second wafer-shaped object is supported on a second support structure within the thermal processing chamber, the second support structure supporting the second wafer-shaped object within the edge exclusion region.

13. A method as defined in claim 1, wherein the first wafer-shaped object is supported in the thermal processing chamber by a first support structure and the second wafer-shaped object is supported in the thermal processing chamber by a second support structure, each support structure emitting gas jets that support the corresponding wafer-shaped objects.

14. A method as defined in claim 1, wherein the first wafer-shaped object and the second wafer-shaped object are supported in the thermal processing chamber by cushions of gas.

15. A method as defined in claim 1, wherein the first wafer-shaped object and the second wafer-shaped object are rotated during processing.

16. A process as defined in claim 1, further comprising the step of introducing a gas into the thermal processing chamber during processing.

17. A method as defined in claim 1, further comprising the step of cooling the wafer-shaped objects after processing, the wafers being cooled by flowing a gas over at least one surface of each wafer-shaped object.

18. A method as defined in claim 1, wherein each wafer-shaped object is placed in the thermal processing chamber by a robot arm and wherein at least one of the wafer-shaped objects is inverted prior to being placed in the thermal processing chamber.

19. A method as defined in claim 1, wherein the first wafer-shaped object is spaced from about 0.5 mm to about 4 mm from the second wafer-shaped object.

20. A method as defined in claim 1, wherein the first wafer-shaped object is spaced greater than 4 mm from the second wafer-shaped object.

21. A method as defined in claim 2, wherein a gas is introduced in between the first side of the first wafer-shaped object and the first side of the second wafer-shaped object during processing.

22. A method as defined in claim 7, wherein the first temperature measuring device and the second temperature measuring device both comprise pyrometers.

23. A method as defined in claim 7, wherein the first temperature measuring device measures the temperature of the first wafer-shaped object in a center region of the first object, the second temperature measuring device measuring the temperature of the second wafer-shaped object at a center region of the second object, and wherein a third temperature measuring device measures the temperature of the first wafer-shaped object at an edge region of the first object and a fourth temperature measuring device measures the temperature of the second wafer-shaped object at an edge region of the second object, each of the temperature measuring devices being in communication with the controller for implementing the temperature-timed trajectory.

24. A method as defined in claim 7, further comprising the step of calibrating the first temperature measuring device and the second temperature measuring device by placing in the thermal processing chamber a first calibration wafer containing a first thermocouple and a second calibration wafer containing a second thermocouple, the first thermocouple being present at a first surface of the first calibration wafer and the second thermocouple being present at a first surface of the second calibration wafer, and wherein the calibration wafers are positioned in the thermal processing chamber such that the first side of the first calibration wafer faces the first side of the second calibration wafer.

25. A method as defined in claim 7, wherein the controller heats the wafer-shaped objects using closed-loop control.

26. A method as defined claim 7, wherein the controller heats the wafer-shaped objects using open-loop control.

27. A method as defined in claim 8, wherein the first heating device comprises a plurality of radiant energy sources and the second heating device also comprises a plurality of radiant energy sources.

28. A method as defined in claim 11, wherein the first wafer-shaped object includes a first thickness and is in a first plane within the thermal processing chamber and wherein the second wafer-shaped object includes a second thickness and is in a second plane in the thermal processing chamber and wherein the first slip free ring is in substantially the same plane and has a thickness of from about 50% to about 200% of the thickness of the first wafer-shaped object and the second slip free ring is in substantially the same plane and has a thickness of from about 50% to about 200% of the thickness of the second wafer-shaped object.

29. A method as defined in claim 11, wherein the first and second slip free rings comprise silicon.

30. A method as defined in claim 11, wherein the first wafer-shaped object is supported on the first slip free ring within the thermal processing chamber and the second wafer-shaped object is supported on the second slip free ring in the thermal processing chamber.

31. A method as defined in claim 11, wherein the slip free rings move in order to facilitate loading of the wafer-shaped objects as they are placed in the thermal processing chamber.

32. A method as defined in claim 11, wherein the wafer-shaped objects and the slip free rings move in and out of the thermal processing chamber together.

33. A method as defined in claim 12, wherein the edge exclusion regions have a width of no more than about 5 mm.

34. A method as defined in claim 12, wherein each support structure includes a plurality of pins that support the corresponding wafer-shaped object.

35. A method as defined in claim 12, wherein the first and second support structures are ring-shaped.

36. A method as defined in claim 12, wherein the first and second support structures define inclined surfaces that contact the corresponding wafer-shaped objects.

37. A method as defined in claim 15, wherein the first wafer-shaped object and the second wafer-shaped object are rotated in the same direction.

38. A method as defined in claim 15, wherein the first wafer-shaped object and the second wafer-shaped object are rotated in opposite directions.

39. A method as defined in claim 15, wherein the thermal processing chamber includes a rotation mechanism that rotates both wafer-shaped objects.

40. A method as defined in claim 15, wherein the thermal processing chamber includes a first rotation mechanism for rotating the first wafer-shaped object and a second rotation mechanism for rotating the second wafer-shaped object.

41. A method as defined in claim 22, wherein one of the pyrometers includes a radiation collecting device that collects radiation that emanates from in between the wafer-shaped objects.

42. A method as defined in claim 22, wherein each pyrometer includes a radiation collecting device for collecting thermal radiation being emitted by a corresponding wafer-shaped object, and wherein the first and second wafer-shaped objects are positioned in between opposing radiation collecting devices for the two pyrometers.

43. A method as defined in claim 22, wherein the thermal processing chamber is in communication with a first heating device and a second heating device, the first and second wafer-shaped objects being positioned in between the first and second heating devices, each of the heating devices comprising a plurality of radiant energy sources, and wherein, the first and second temperature measuring devices are calibrated by measuring at least one of reflectance and transmittance of at least one calibration wafer prior to processing.

44. A method as defined in claim 32, wherein the first slip free ring includes a first substrate holder for holding the first wafer-shaped object and the second slip free ring includes a second substrate holder for holding the second wafer-shaped object.

45. A method as defined in claim 34, wherein the pins are made from a material comprising fused silica, sapphire, aluminum oxide, AEON, silicon, or silicon carbide.

46. A method as defined in claim 35, wherein the first and second support structures include at least three landing areas upon which the corresponding wafer-shaped objects are supported, the landing areas having a tapered shape.

47. A method as defined in claim 41, wherein the wafer-shaped objects are rotated during processing, and wherein the radiation collecting devices rotate with the wafer-shaped objects.

48. A method as defined in claim 41, wherein the wafer-shaped objects are rotated during processing, and wherein the radiation collecting devices remain stationary during rotation of the wafer-shaped objects.

49. A method as defined in claim 46, wherein the ring-shaped portions of the support structures have a thickness and wherein the landing areas are thinner than the ring-shaped portions.

50. A semiconductor wafer processing system comprising:
a processing chamber;
a first substrate holder and a second substrate holder contained within the processing chamber, the first substrate holder being configured to hold a first semiconductor wafer having a working side and a back side, the second substrate holder being configured to hold a second semiconductor wafer also having a working side and a back side, the first and second substrate holders being configured to hold the first and second semiconductor wafers such that the working side of the first semiconductor wafer faces the working side of the second semiconductor wafer;
a plurality of light energy sources in communication with the processing chamber for heating semiconductor wafers held by the first and second substrate holders; and
a first pyrometer and a second pyrometer that measure the temperature of semiconductor wafers contained within the processing chamber, the first pyrometer being positioned to measure the temperature of a semiconductor wafer held by the first substrate holder, the second pyrometer being positioned to measure the temperature of a semiconductor wafer held on the second substrate holder, the first and second pyrometers measuring the temperature of the wafers by sensing the amount of electromagnetic radiation being emitted by the wafers, the first pyrometer being configured to measure the amount of electromagnetic radiation being emitted by a semiconductor wafer held on the first substrate holder, while the second pyrometer being configured to measure the amount of electromagnetic radiation being emitted by a semiconductor wafer being held on the second substrate holder.

51. A system as defined in claim 50, wherein the first pyrometer includes a radiation collecting device that faces a working side of a semiconductor wafer held on the first substrate holder, and the second pyrometer including a radiation collecting device that faces a working side of a semiconductor wafer held on the second substrate holder.

52. A system as defined in claim 50, further comprising a controller in communication with the first pyrometer, the second pyrometer, and the light energy sources, the controller being configured to control the amount of light energy being emitted by the light energy sources in response to temperature information received from the first and second pyrometers.

53. A system as defined in claim 50, wherein the first and second substrate holders are configured to hold semiconductor wafers in a substantially parallel relationship, the plurality of light energy sources including a first set of light energy sources that face a back side of a semiconductor wafer held by the first substrate holder and a second set of light energy sources that face a back side of a semiconductor wafer held on the second substrate holder.

54. A system as defined in claim 50, wherein the light energy sources are located outside the processing chamber, the light energy sources being separated from the chamber by at least one window.

55. A system as defined in claim 50, further comprising a gas inlet and a gas outlet in communication with the processing chamber for circulating gases therethrough or for reducing or increasing the pressure within the chamber.

56. A system as defined in claim 50, wherein at least one of the substrate holders is configured to contact a semiconductor wafer held on the substrate holder only within one edge exclusion region.

57. A system as defined in claim 50, further comprising a slip free ring configured to at least partially surround a semiconductor wafer being held on the first substrate holder and a second slip free ring configured to at least partially surround a semiconductor wafer held on the second substrate holder.

58. A system as defined in claim 50, wherein the first substrate holder comprises at least one arm that terminates in a support surface for contacting a semiconductor wafer being held on the substrate holder, the arm extending above the support surface, and wherein the second substrate holder also includes an arm terminating in a support surface for contacting a semiconductor wafer held on the second substrate holder, the arm of the second substrate holder extending below the support surface.

59. A system as defined in claim 50, further comprising a third pyrometer and a fourth pyrometer, the first pyrometer being configured to sense a temperature of a semiconductor wafer held on the first substrate holder in a center area of the wafer, the third pyrometer being configured to sense the temperature of the wafer on the first substrate holder within a peripheral region and wherein the second pyrometer is configured to measure the temperature of a semiconductor wafer being held on the second substrate holder in a center area of the wafer and the fourth pyrometer is configured to measure the temperature of the semiconductor wafer being held on the second substrate holder within a peripheral region of the wafer.

60. A system as defined in claim 50, wherein the first substrate holder and the second substrate holder are positioned so that a working side of a semiconductor wafer being held on the first substrate holder is less than about 4 mm from a working side of a semiconductor wafer held on the second substrate holder.

61. A system as defined in claim 50, wherein the first substrate holder and the second substrate holder are positioned so that a working side of a semiconductor wafer being held on the first substrate holder is greater than about 4 mm from a working side of a semiconductor wafer held on the second substrate holder.

62. A system as defined in claim 50, wherein the system includes a rotation mechanism for rotating semiconductor wafers being held on the first and second substrate holders.

63. A system as defined in claim 50, further comprising a first rotation mechanism for rotating a semiconductor wafer being held on the first substrate holder and a second rotation mechanism for rotating a semiconductor substrate being held on the second substrate holder.

64. A system as defined in claim 50, wherein at least one of the substrate holders includes inclined surfaces that are configured to only contact an edge of a semiconductor wafer held on the substrate holder.

65. A system as defined in claim 55, wherein the gas inlet is configured to emit gases such that at least 20% of the gas flow is directed in between wafers positioned on the first substrate holder and the second substrate holder.

66. A system as defined in claim 56, wherein the first substrate holder includes at least three arms for contacting a semiconductor wafer in three locations and wherein the second substrate holder also includes at least three arms for contacting a semiconductor substrate in at least three locations.

67. A system as defined in claim 57, wherein the first and second slip free rings move between an engagement position and a non-engagement position within the processing chamber, and wherein, when in the engagement position, the slip free rings surround semiconductor wafers held on the substrate holders and wherein when in the non-engagement position, the slip free rings allow for wafers to be moved into and out of the processing chamber.

68. A semiconductor wafer processing system comprising:
a processing chamber;
a first substrate holder and a second substrate holder contained within the processing chamber, the first substrate holder being configured to hold a first semiconductor wafer having a top surface and a bottom surface, the second substrate holder being configured to hold a second semiconductor wafer also having a top surface and a bottom surface, the first and second substrate holders being configured to hold the first and second semiconductor wafers such that the top surface of the first semiconductor wafer faces the top surface of the second semiconductor wafer;
a plurality of light energy sources in communication with the processing chamber for heating semiconductor wafers held by the first and second substrate holders;
first and second pyrometers for measuring the temperature of a semiconductor wafer being held on the first substrate holder, the first pyrometer being positioned to measure a center area of the wafer and the second pyrometer being positioned to measure the temperature of an edge region of the wafer; and
third and fourth pyrometers for measuring the temperature of a semiconductor wafer being held on the second substrate holder, the third pyrometer being configured to measure the temperature of a center area of the semiconductor wafer, while the fourth pyrometer being configured to measure the temperature of an edge region of the semiconductor wafer.

69. A semiconductor wafer processing system comprising:
a processing chamber;
a first substrate holder and a second substrate holder contained within the processing chamber, the first substrate holder being configured to hold a first semiconductor wafer having a top surface and a bottom surface, the second substrate holder being configured to hold a second semiconductor wafer also having a top surface and a bottom surface, the first and second substrate holders being configured to hold the first and second semiconductor wafers such that the top surface of the first semiconductor wafer faces the top surface of the second semiconductor wafer; and
a plurality of light energy sources in communication with the processing chamber for heating semiconductor wafers held by the first and second substrate holders.

* * * * *

UNITED STATES PATENT AND TRADEMARK OFFICE
CERTIFICATE OF CORRECTION

PATENT NO. : 7,977,258 B2  
APPLICATION NO. : 11/784503  
DATED : July 12, 2011  
INVENTOR(S) : Zsolt Nenyei et al.

It is certified that error appears in the above-identified patent and that said Letters Patent is hereby corrected as shown below:

Column 19, line 43 (Claim 45, line 3) "AEON" should read --AION--

Signed and Sealed this
Twenty-eighth Day of August, 2012

David J. Kappos
*Director of the United States Patent and Trademark Office*